United States Patent [19]

Solstad

[11] Patent Number: 4,689,875
[45] Date of Patent: Sep. 1, 1987

[54] INTEGRATED CIRCUIT PACKAGING PROCESS

[75] Inventor: Russell V. Solstad, St. Paul, Minn.

[73] Assignee: VTC Incorporated, Bloomington, Minn.

[21] Appl. No.: 828,876

[22] Filed: Feb. 13, 1986

[51] Int. Cl.⁴ .......................................... H01L 23/04
[52] U.S. Cl. .................................... 437/211; 357/80; 357/70; 29/835; 437/209
[58] Field of Search ...................... 29/576 S, 591, 588, 29/835; 357/70, 80

[56] References Cited

U.S. PATENT DOCUMENTS

| | | | |
|---|---|---|---|
| 3,395,447 | 6/1968 | Beyerlein | 29/576 S |
| 3,698,074 | 10/1972 | Helda et al. | 29/626 |
| 3,735,214 | 5/1973 | Renskers et al. | 317/234 R |
| 4,132,856 | 1/1979 | Hutchison et al. | 174/52 PE |
| 4,280,132 | 7/1981 | Hayakawa et al. | 29/588 |

Primary Examiner—Brian E. Hearn
Assistant Examiner—Beverly A. Pawlikowski
Attorney, Agent, or Firm—Kinney & Lange

[57] ABSTRACT

The present invention is a method for packaging and protecting an integrated circuit chip on a carrier tape. A carrier tape comprising at least two bonded layers (one layer being made of an electrically conductive material) includes small flat leads in the conductive layer. A carrier bridge or frame of nonconductive material is bonded to one surface of the leads and is connected to a nonconductive layer (or a part of) the tape. The electrical pads of an integrated circuit are bonded to the respective leads of the tape simultaneously. The leads are cut at a predetermined length from the chip and outside of the frame. The lead ends are bent to form a nest. A planar base is adehered to the surface of the chip having the electrical pads. The leads are then bent over the base to secure the base on the tape and provide electrical contact points to the chip. The chip is coated with a suitable material and to provide insulation and encapsulation of the entire packaging structure. At a desired time, the complete chip packaging structure may be removed from the tape by cutting the frame.

14 Claims, 17 Drawing Figures

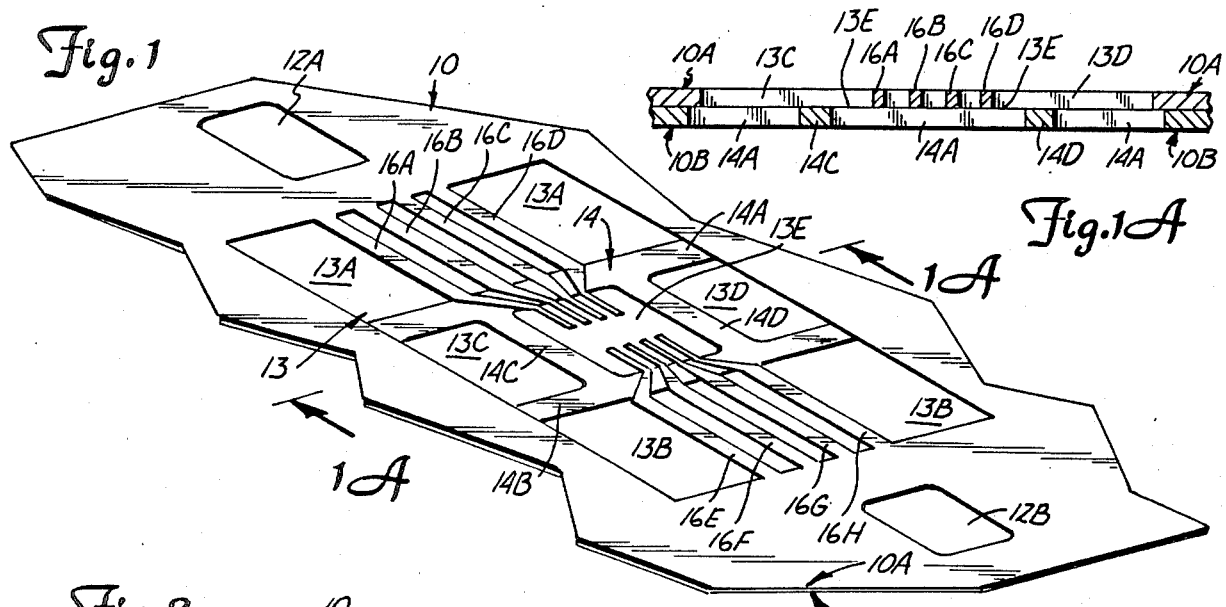

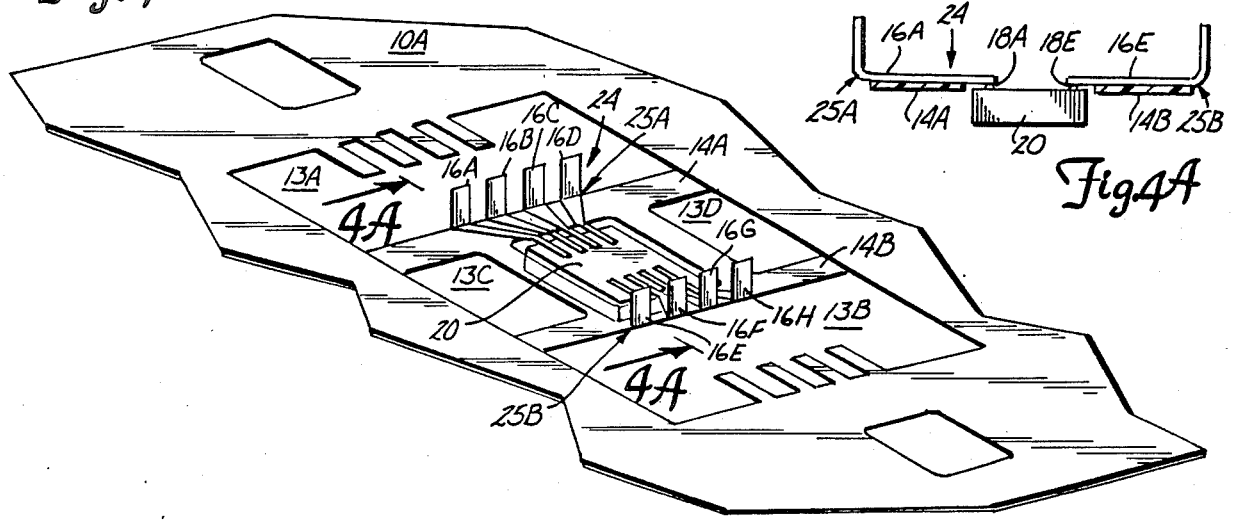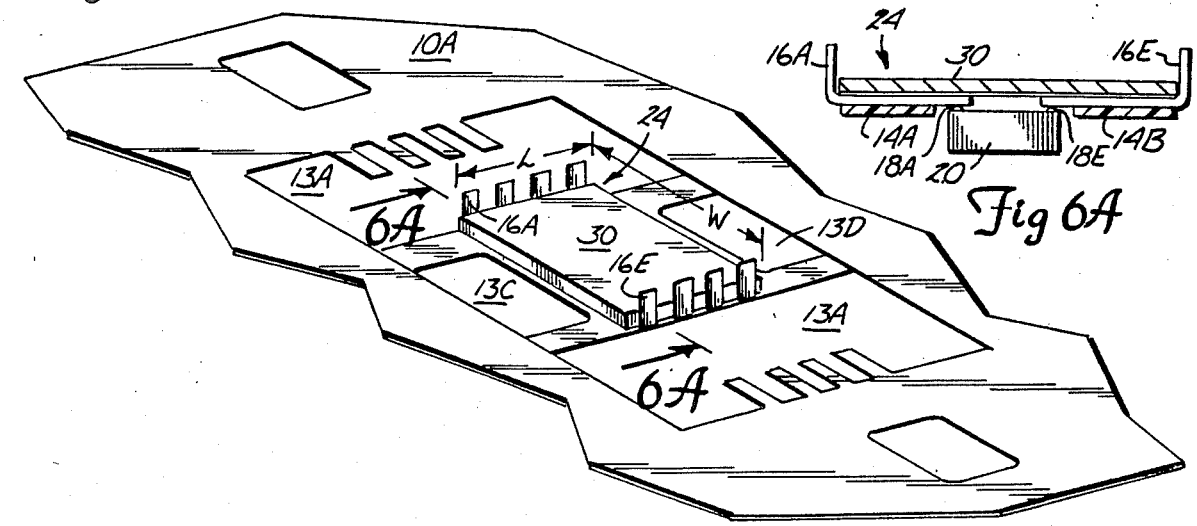

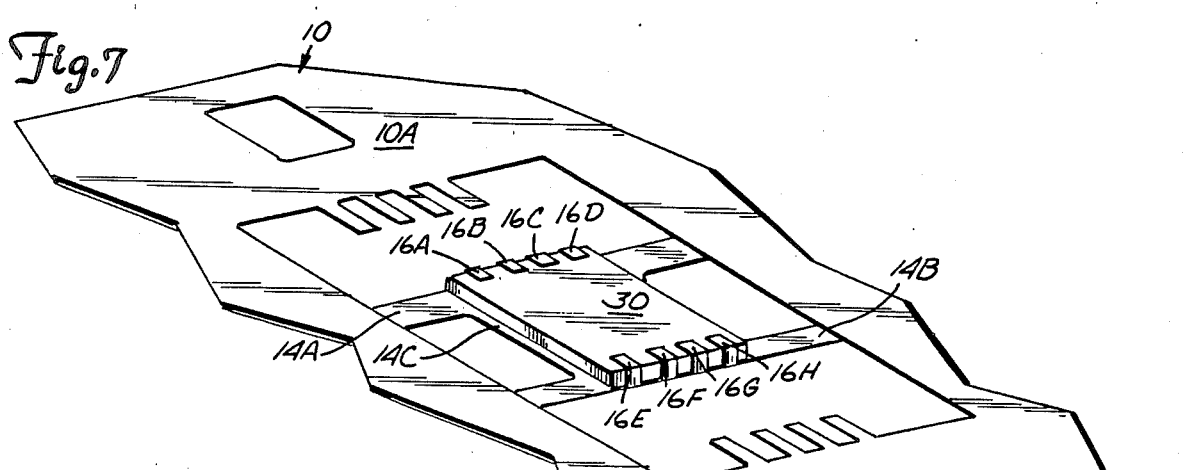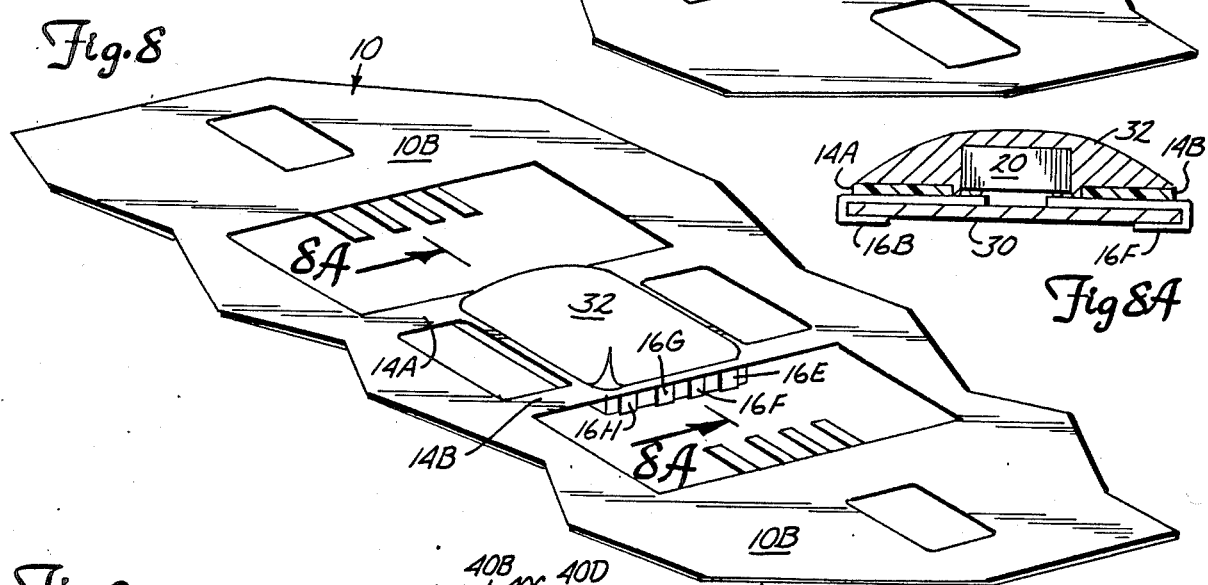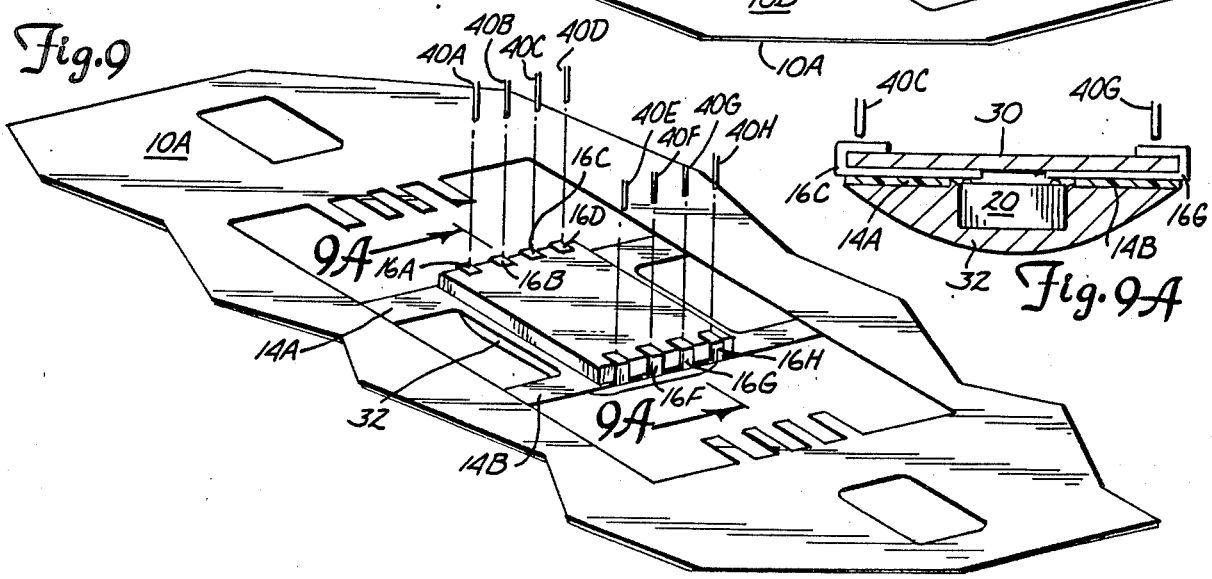

INTEGRATED CIRCUIT PACKAGING PROCESS

BACKGROUND OF THE INVENTION

1. Field of the Invention

The present invention generally relates to packaging integrated circuits, and more particularly is concerned with a method for packaging integrated circuits on a continuous reel or supply.

2. Description of the Prior Art

Conventional bonding of an integrated circuit or semiconductor device to a desired substrate is a process wherein a fine electrically-conductive wire is individually bonded to each electrical contact or pad of the integrated circuit. Such bonding involves individual alignment of a wire to each pad, and for integrated circuits which have many pads, may require a great deal of time and thereby increase costs.

An improved method of bonding and packaging integrated circuits is known as tape automated bonding or "TAB". In this system, chips are bonded to a carrier tape to form a supply. The tapes are then stored on reels for use in automated operations in known manners. Generally, the carrier tapes range in width from 8 mm. to 70 mm. and are multi-layer structures. A typical tape is a two layer strata of polyimide bonded to copper. Desired patterns are stamped or etched in the tape to form a station on the tape for receiving a chip. The patterns include small, flat fingers or leads in the copper layer which fan out to wider leads. Undesired polyimide surrounding the leads is removed.

An integrated circuit or chip is positioned above the station so that the contacts are aligned with the small fingers or leads. In a single operation, pads are thermally bonded to their respective leads simultaneously. The bonding operation can involve as many leads and pads as desired, with all bonding being performed in one step. To enhance conductivity, the leads may be plated with gold or other suitable materials before bonding.

After bonding is completed, the chips remain attached to the tape by the bond between the contact points and the fingers. The fingers are connected to the leads, which in turn are connected to the uncut portions of the tape. At a desired time, the leads are cut and the chip is removed from the tape. The chip and the cut leads may then be connected to a desired substrate.

Chips bonded to a carrier tape by the TAB process as described above provide a reel of components that may be used in automated assembly operations. Such reels may be transported to desired locations for testing and assembly and the like. Utilization of a TAB system increases production and provides an economical and reliable means for assembling and bonding integrated circuits.

While a TAB process provides an improved chip assembly method, several problems may arise during its use that render a chip unsatisfactory. First, chips bonded to carrier tapes are unprotected and exposed. Accidents and spills may introduce foreign materials to the chip environment. Second, as the carrier tape is wound on a reel, the chips risk being damaged or torn from the tape by mechanical stresses. Third, bonded leads may be broken or pulled away from a chip. Fourth, transportation and handling of the reels may jar a chip from the tape.

Consequently, a need arises for improvements in packaging and protecting integrated circuits bonded to carrier tapes. Improvements are needed to overcome the shortcomings of known bonding systems and to ensure reliability of chips after they have been bonded to a tape.

SUMMARY OF THE INVENTION

The present invention discloses a structure and method for packaging integrated circuits or chips after the chips have been bonded to a carrier tape. The invention embodies a process for assembling a chip protection structure on a carrier tape that is to be wound on a supply reel. The present invention teaches an economical method for ensuring the reliability of a chip after it has been bonded on a carrier tape.

The present invention is a method for packaging and protecting an integrated circuit or chip on a carrier tape. A carrier tape comprising at least two bonded layers (one layer being made of an electrically conductive material) includes small flat leads in the conductive layer. A carrier bridge or frame of nonconductive material is bonded to one surface of the leads and is connected to a nonconductive layer (or a part of) the tape. The electrical pads of an integrated circuit are bonded to the leads of the tape simultaneously. The leads are cut at a predetermined length from the chip and outside of the frame. The cut lead ends are bent to form a nest. A planar base is adhered to the surface of the chip having the electrical pads. The leads are then bent over the base to secure the base on the tape and to provide electrical contact points for the chip. The chip is coated with a suitable material to provide insulation and encapsulation of the entire packaging structure. A tape containing chip packaging structures may be wound on a supply reel for testing and transportation. At a desired time, the complete chip packaging structure may be removed from the tape by cutting the frame.

BRIEF DESCRIPTION OF THE DRAWINGS

FIG. 1 is a perspective view of a carrier tape utilized in the present method before an integrated circuit or chip is bonded to the tape.

FIG. 1A is a greatly enlarged sectional view taken along line 1A—1A of FIG. 1.

FIG. 2 is a perspective view of an integrated circuit or chip bonded to the underside of leads of a carrier tape.

FIG. 3 is a perspective view showing the leads cut at a predetermined distance outside of a frame.

FIG. 4 is a perspective view showing the cut leads bent upwardly to form a nest.

FIG. 4A is a sectional view taken along line 4A—4A of FIG. 4.

FIG. 5 is a perspective view representing the addtion of an epoxy adhesive on the chip.

FIG. 6 is a perspective view showing the addition of a support base on the chip and within the nest.

FIG. 6A is a sectional view taken along line 6A—6A of FIG. 6.

FIG. 7 is a perspective view showing the leads bent down over the base.

FIG. 8 is a perspective view in which the tape of FIG. 7 has been inverted and showing the chip coated by an epoxy encapsulation.

FIG. 8A is a sectional view taken along line 8A—8A of FIG. 8.

FIG. 9 is a perspective view in which the tape of FIG. 8 has been inverted and showing test probes positioned above the leads clamped around the base.

FIG. 9A is a sectional view taken along 9A—9A of FIG. 9.

DETAILED DESCRIPTION OF THE PREFERRED EMBODIMENT

Figure 10:
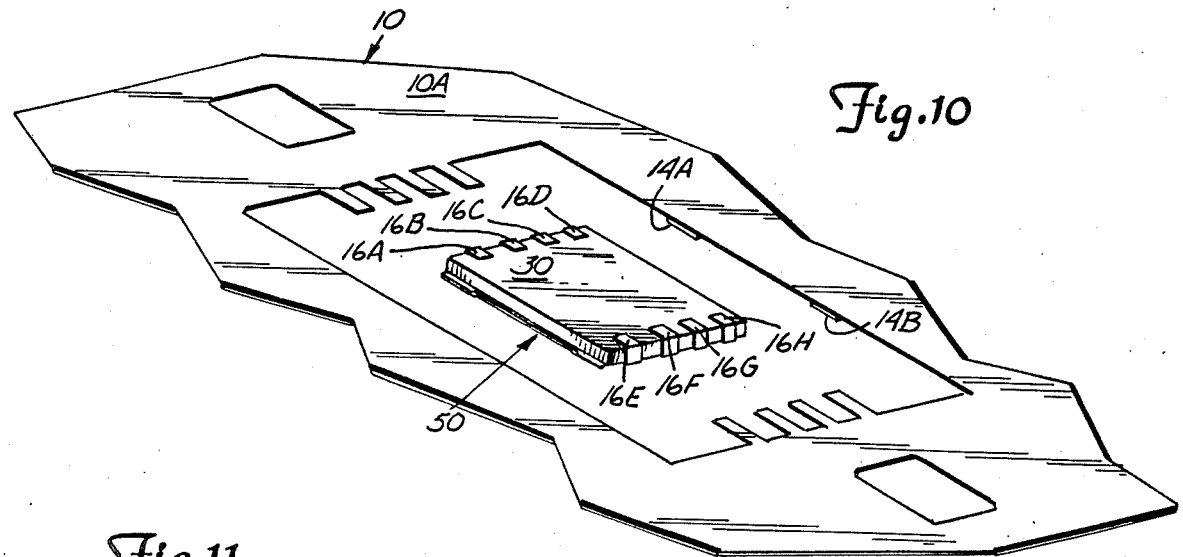
FIG. 10 is a perspective view of a chip package structure after the frame has been removed.

The present invention is a method for assemblying and packaging an integrated circuit on a carrier tape. A series of drawings are referred to in this description and refer to successive steps of the method. As shown in FIG. 1 (and FIG. 1A), carrier tape 10 consists of two layers bonded together in a known manner, with one of the layers being formed from an electrically conductive material. In the method of the present invention, a tape 10 is composed of a metal layer 10A (preferably formed of copper coated with gold) bonded to a plastic insulating substrate 10B (preferably of polyimide). However, it will be understood that other tape strata combinations may be utilized. Patterns are formed in metal layer 10A by conventional photoresist and etching techniques, and patterns are formed in substrate 10B by selective removal of portions of substrate 10B using conventional techniques such as die cutting.

In FIG. 1 the metal layer 10A is shown facing up, while the substrate layer 10B is shown facing down. Sprocket openings 12A and 12B extend through metal layer 10A and substrate 10B of the tape 10, and are provided for driving tape 10 along a path from station to station for processing, and for winding the tape 10 on a reel in a known manner.

As shown in FIG. 1, a rectangularly-shaped opening is provided between sprocket openings 12A and 12B to define a chip bonding area 13. A carrier bridge or frame 14, which is preferably an integral part of substrate 10B, subdivides chip bonding area 13 into five generally rectangular openings 13A-13E. The bridge 14 consists of two parallel strips 14A and 14B which run parallel to the longitudinal axis of the tape 10, and two cross bars 14C and 14D which extend between strips 14A and 14B to provide stability for the bridge 14 and define the small rectangular opening 13E in the center of the chip bonding area 13 where the integrated circuit will be bonded.

Metal layer 10A covers essentially the entire top surface of tape 10, with the exception of the chip bonding area 13 and the sprocket openings 12A and 12B. Within the chip bonding area 13, metal layer 10A includes four leads 16A-16D which extend from the edge of the chip bonding area across opening 13A, over strip 14A and project over opening 13E. Similarly, leads 16E-16H extend from an opposite edge of the chip bonding area across opening 13B, over strip 14B, and project over opening 13E. The free ends of leads 16A-16H are positioned to make contact with corresponding contact pads 18A-18H (see FIGS. 4A and 12) of an integrated circuit chip 20, as shown in FIG. 2.

For the purposes of illustration, eight leads 16A-16H are shown in the Figures. It will be understood, however, that the number of leads may vary, depending on the particular integrated circuit chip 20. The greatly enlarged sectional view of FIG. 1A clearly shows the two-layer composition of the carrier tape 10. In the figure, beginning at the left end, line 1A—1A cuts through the metal layer 10A and crosses opening 13C. Note that the uncut portion of layer 10A which borders the opening 13C is shown. Next, line 1A—1A cuts through leads 16A-16D and opening 13E and crosses opening 13D, wherein the uncut metal layer 10A is visible. Line 1A-1A concludes with a sectional view of the metal layer 10A.

As shown in the bottom layer of FIG. 1A, Line 1A—1A of FIG. 1 cuts through the substrate 10B, crosses opening 13C wherein strip 14A is visible, cuts cross bar 14C and enters opening 13E wherein strip 14A is visible. Line 1A—1A concludes by cutting cross bar 14D, entering opening 13D wherein strip 14A is visible and cuts substrate 10B. Note that the metal layer 10A extends slightly beyond the substrate 10B into openings 13C and 13D of the left and right ends of FIG. 1A, respectively.

In FIG. 2, the integrated circuit chip 20 is positioned below opening 13E and is thermally bonded to the free ends of leads 16A-16H. Each lead 16A-16H is bonded to a corresponding electrical contact pad 18A-18H on the chip 20 (see FIGS. 4A and 12). Thermal bonding is preferred so that all of the leads 16A-16H are bonded simultaneously to their respective contact pads 18A-18H.

FIG. 3 shows the next step of the present method. Once the chip 20 is bonded to the leads 16A-16H, a portion of the leads 16A-16H is cut and removed. The leads 16A-16D are cut at a predetermined point 22A over opening 13A and the leads 16E-16H are cut at a predetermined point 22B over opening 13B.

Next, the now free ends of leads 16A-16H are formed or bent to form a "nest" 24, as can be seen in FIGS. 4 and 4A. The leads 16A-16H are bent substantially perpendicularly to the plane of the tape 10 in the direction opposite of the chip 20. Leads 16A-16D are bent at the point 25A where the leads 16A-16D extend beyond the strip 14A, while leads 16E-16H are bent at a similar point 25B along strip 14B. The cutting step of FIG. 3 and the bending step of FIG. 4 may be combined as a single operation.

Once the nest 24 has been formed, a small amount of epoxy 26 is deposited between the leads 16A-16H on the chip 20 as indicated in FIG. 5. After the epoxy 26 has been applied on the chip 20, a flat rectangular base 30 is placed over the epoxy 26 and inside the nest 24, as shown in FIGS. 6 and 6A. The base 30 is added to provide rigidity to the final chip protection structure which is described below. The base 30, formed from a nonconductive material, is of a predetermined thickness less than the height of the vertically extending leads 16A-16H. A polyimide base 30 of a thickness slightly greater than the substrate 10B has been found to be satisfactory. The width (W) dimension of the base 30 is substantially the same as the distance between the row of leads 16A-16D and the row of leads 16E-16H. The length (L) of the base 30 is substantially the same as the distance between the outer edges of the cross sections 14C and 14D of the frame 14. Thus, after the base 30 has been added to the frame 14, the rectangular opening 13E is completely covered by the base 30.

The free ends of the leads 16A-16H are formed or bent over the base 30 to secure the base 30 to the chip 20, as shown in FIG. 7. The base 30 is thin enough so that after the free ends of leads 16A-16H have been bent over the base 30, they provide contact points for electrical connection between chip 20 and the electrical circuit in which it is installed. It is preferred that after the free ends of leads 16A-16H have been formed down, the tape 10 carrying the base 30 is passed through an infrared oven to cure the epoxy 26.

After the free ends of leads 16A-16H are bent over the base 30, chip 20 and base 30 may be removed from the tape 10 by cutting the strips 14A and 14B of the carrier bridge or frame 14 at or near the points where the strips 14A and 14B extend beyond the base 30. The base 30 provides a rigid platform to protect the chip.

However, it is preferred that the chip 20 be further protected. Particularly when the tape 10 is to be rewound after chip bonding, the chip 20 is subjected to mechanical stresses from overlapping tape 10. It is preferred that an epoxy coating 32 is applied to the surface of the chip 20 opposite the contact points 18A-18H. The tape 10 is inverted by either winding the tape and inverting the reel or by means such as a turner along the tape path. When inverted, as shown in FIGS. 8 and 8A, the substrate 10B of the tape 10 is facing upward. A sufficient amount of epoxy 32 is applied to completely coat the chip 20. The epoxy coating 32 encapsulates the chip 20 and flows onto the frame strips 14A and 14B and cross sections 14B and 14D. After the epoxy 32 is applied, it is preferred that the chip packaging structure be passed through an infrared oven to cure the epoxy 32. The epoxy 32 coating provides a rigid cover which protects the chip 20 as it is wound on the tape 10 and does not interfere with chip 20 operation after removal from the tape 10.

After curing is complete, the tape 10 may again inverted so that the base 30, the free ends of leads 16A-16H and the metal layer 10A of the tape 10 are facing upward. At this point, it is preferred that the chip 20 be passed under a testing station where testing probes 40A-40H ensure reliability of each chip 20. A probe 40A-40H is positioned above each lead 16A-16H to test electrical reliability. Any chips 20 which are found to be defective are removed from the tape 10.

Once testing is complete, the tape 10 along with the packaged integrated circuits 20 may be wound on a reel and stored or transported as desired. The reel may be placed in an automated assembly operation where the chip package structure 50 is removed and installed. As shown in FIG. 10, the strips 14A and 14B are cut and removed so that the chip packaging structure 50 is free from the tape 10. The structure 50 is installed as desired.

Figure 11:
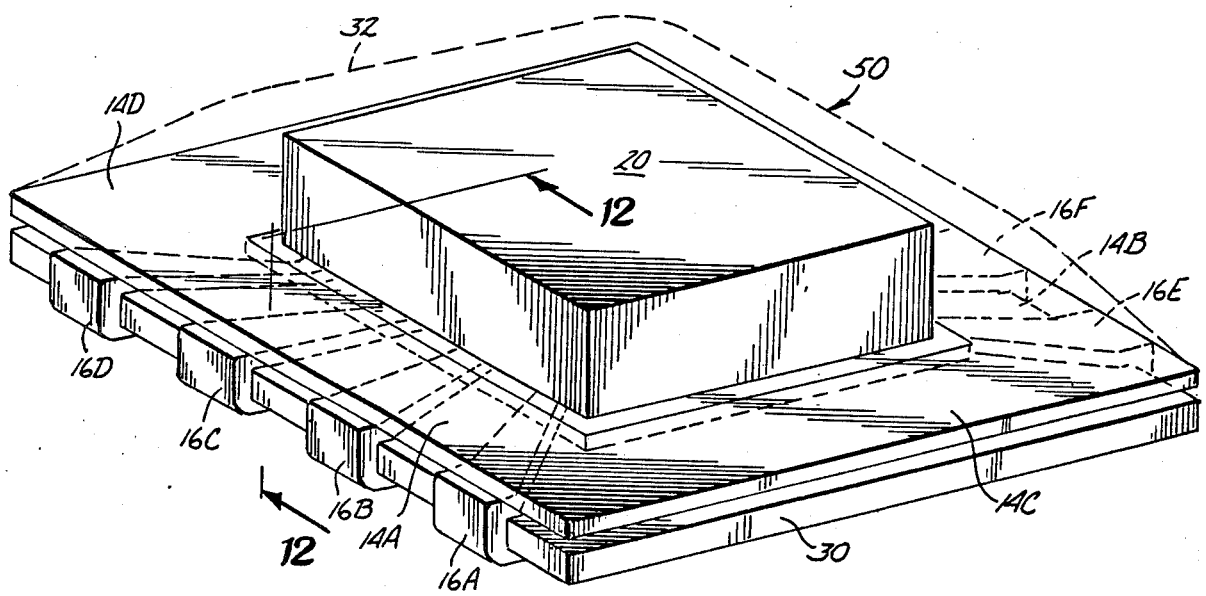
FIG. 11 is an enlarged perspective view of the chip package structure after removal from the carrier tape.
Figure 12:
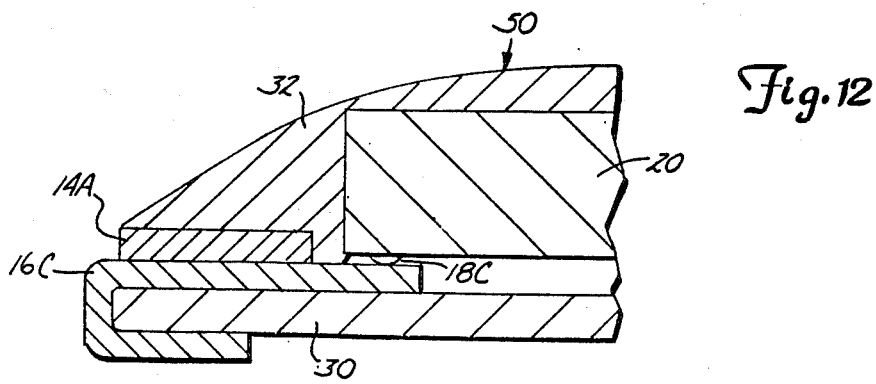
FIG. 12 is a partial sectional view taken along line 12—12 of FIG. 11.

The chip package structure 50 is shown in further detail in FIGS. 11 and 12. The leads 16A-16H are bonded to the electrical contact pads 18A-18H of the chip 20. The leads 16A-16H fan out and widen, and the outer portions of leads 16A-16H are bent over the base 30. The epoxy coating 32 completely encapsulates the chip 20 and rests on the strips 14A and 14B and cross sections 14C and 14D of the carrier tab 14. As can be seen best in FIG. 12, the epoxy 32 fills the spaces between the chip 20 and the frame sections 14A-14D in such a manner that the chip contact pads 18A-18H are protected from the environment.

The present process is especially useful for integrated circuit components required for miniaturized circuitry. The process has been advantageously utilized, for example, for integrated circuits incorporated in hearing aid devices. The packaging structure 50 provides stability for the chip 20 so that it may be stored and transported. The use of the tape 10 allows an automated system to be utilized in the final assembly process of the structure 50.

Although the present invention has been described with reference to preferred embodiments, workers skilled in the art will recognize that changes may be made in form and detail without departing from the spirit and scope of the invention.

What is claimed is:

1. A method for packaging semiconductor chips on a carrier tape to produce a carrier tape having packaged semiconductor chips supported thereon, the method comprising:

providing a carrier tape having a nonconductive substrate and a conductive layer, the tape having a plurality of chip bonding areas formed by an opening in the substrate with a chip support frame extending across the opening and a corresponding opening in the conductive layer with conductive leads extending from edges of the opening in the conductive layer to the frame to provide first free ends for bonding to a chip;

aligning semiconductor chips with the chip support frames so that contact pads on a first surface of the chips are positioned opposite respective first free ends of the leads;

bonding the contact pads of the semiconductor chips and the first free ends of the leads;

severing the leads from the conductive layer at predetermined distance from the frames to form second free ends;

bending the second free ends of the leads substantially perpendicularly to a plane of the carrier tape away from the semiconductor chips to form nests;

applying an adhesive to the first surface of the semiconductor chips;

positioning bases on the adhesive and within the nests; and bending the second free ends of the leads over the bases.

2. The method of claim 1 and further including the step of:

curing the adhesive in presence of infrared radiation.

3. The method of claim 1 and further including the step of:

coating a second surface of the semiconductor chips and the adjoining portions of the frames with an encapsulating material to encapsulate the semiconductor chips.

4. The method of claim 3 and further including the step of:

curing the encapusulating material in presence of infrared radiation.

5. The method of claim 1 wherein the steps of severing and bending are performed essentially simulataneously.

6. The method of claim 1 and further including the step of:

removing the semiconductor chips from the carrier tape by severing the frames near points where the frames extend beyond the bases.

7. The method of claim 1 wherein the frames include a pair of parallel strips extending from a first edge of the openings in the substrate to a second opposite edge.

8. The method of claim 7 wherein the frames further includes a pair of cross bars provided between the parallel strips to define generally rectangular openings for alignment with the semiconductor chips.

9. The method of claim 8 wherein the first free ends of the leads are positioned over the generally rectangular openings.

10. The method of claim 9 wherein the leads extend from edges of the openings in the conductive layer in a direction generally perpendicular to a longitudinal direction of the parallel strips.

11. The method of claim 10 wherein the bases are generally rectangular, with first and second generally parallel major surfaces.

12. The method of claim 11 wherein the first major surface of the bases face and are generally parallel to the first surface of the semiconductor chips when the bases are positioned in the nests.

13. The method of claim 12 wherein the bases have a thickness which is less than a length of the leads so that the second free ends are bent over the second major surface of the bases.

14. The method of claim 1 wherein the bases are made of polyimide.

* * * * *